(12) United States Patent
Huang (10) Patent No.: US 11,056,608 B2
(45) Date of Patent: Jul. 6, 2021

(54) INFRARED DETECTION FILM, INFRARED DETECTION SENSOR AND INFRARED DETECTION DISPLAY APPARATUS INCLUDING THE INFRARED DETECTION FILM, AND METHOD OF MAKING THE INFRARED DETECTION FILM

(71) Applicant: SHANGHAI HARVEST INTELLIGENCE TECHNOLOGY CO., LTD., Shanghai (CN)

(72) Inventor: Jiandong Huang, Shanghai (CN)

(73) Assignee: SHANGHAI HARVEST INTELLIGENCE TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 16/641,189

(22) PCT Filed: Aug. 20, 2018

(86) PCT No.: PCT/CN2018/101338
§ 371 (c)(1),
(2) Date: Feb. 21, 2020

(87) PCT Pub. No.: WO2019/037686
PCT Pub. Date: Feb. 28, 2019

(65) Prior Publication Data
US 2020/0295077 A1      Sep. 17, 2020

(30) Foreign Application Priority Data
Aug. 24, 2017   (CN) .................. 201710733229.X (51) Int. Cl.
H01L 31/112    (2006.01)
G02F 1/1333    (2006.01)
(Continued)

(52) U.S. Cl.
CPC ...... H01L 31/1129 (2013.01); G02F 1/13338 (2013.01); H01L 27/1443 (2013.01);
(Continued)

(58) Field of Classification Search
CPC ......... H01L 27/14676; H01L 27/14679; H01L 31/09; H01L 31/10; H01L 31/101;
(Continued)

(56) References Cited

U.S. PATENT DOCUMENTS 8,610,226 B2 * 12/2013 Moriguchi ........ H01L 27/14632
257/431
8,614,493 B2 * 12/2013 Moriguchi ........ H01L 27/14692
257/431
(Continued)

OTHER PUBLICATIONS

Search Report issued to PCT application No. PCT/CN2018/101338 by the CNIPA dated Nov. 23, 2018.

*Primary Examiner* — Eduardo A Rodela
(74) *Attorney, Agent, or Firm* — Womble Bond Dickinson (US) LLP (57) ABSTRACT

An infrared detection film includes a gate electrode, a gate insulating layer, a majority-carrier channel layer, at least one drain terminal, at least one source terminal, and a photovoltaic semiconductor layer. The gate insulating layer is formed on the gate electrode. The majority-carrier channel layer is formed on the gate insulating layer. Each of the at least one drain terminal and the at least one source terminal is disposed on the majority-carrier channel layer and is spaced apart from the gate electrode. The photovoltaic semiconductor layer is disposed on an exposed portion of the majority-carrier channel layer exposed between the at least one drain terminal and the at least one source terminal.

32 Claims, 11 Drawing Sheets (51) Int. Cl.
  *H01L 27/144* (2006.01)
  *H01L 27/146* (2006.01)
  *H01L 27/32* (2006.01)
  *H01L 31/0224* (2006.01)
  *H01L 31/113* (2006.01)
  *H01L 31/20* (2006.01)
  *H01L 31/09* (2006.01)
  *H01L 31/101* (2006.01)
  *H01L 31/18* (2006.01)
  *H01L 31/109* (2006.01)

(52) U.S. Cl.
  CPC .... *H01L 27/14669* (2013.01); *H01L 27/3227* (2013.01); *H01L 31/022408* (2013.01); *H01L 31/09* (2013.01); *H01L 31/101* (2013.01); *H01L 31/109* (2013.01); *H01L 31/1127* (2013.01); *H01L 31/1136* (2013.01); *H01L 31/18* (2013.01); *H01L 31/202* (2013.01)

(58) Field of Classification Search
  CPC . H01L 31/1013; H01L 31/102; H01L 31/109; H01L 31/112; H01L 31/1124; H01L 31/1126; H01L 31/1127; H01L 31/1129; H01L 31/113; H01L 31/1136; H01L 31/18; H01L 27/14669; H01L 27/1443; H01L 27/3227; H01L 31/022408; H01L 31/202; H01L 31/0224; H01L 27/144; H01L 27/1446; H01L 21/02271; H01L 21/02266; H01L 21/11622; G02F 1/13338; Y02E 10/50; G01J 5/20
  See application file for complete search history.

(56) References Cited

U.S. PATENT DOCUMENTS

| | | | | |
|---|---|---|---|---|
| 2012/0241769 A1* | 9/2012 | Katoh | ............... | G02F 1/13338 257/84 |
| 2012/0292627 A1* | 11/2012 | Moriguchi | ........ | H01L 27/14632 257/59 |
| 2020/0065578 A1* | 2/2020 | Huang | ............. | H04N 5/33 |
| 2020/0229709 A1* | 7/2020 | Huang | ............. | A61B 5/4872 |
| 2020/0327305 A1* | 10/2020 | Huang | ............. | H04W 4/90 |
| 2020/0388719 A1* | 12/2020 | Huang | ............. | H01L 31/113 |
| 2020/0402448 A1* | 12/2020 | Huang | ............. | G06K 9/00 |

* cited by examiner

INFRARED DETECTION FILM, INFRARED DETECTION SENSOR AND INFRARED DETECTION DISPLAY APPARATUS INCLUDING THE INFRARED DETECTION FILM, AND METHOD OF MAKING THE INFRARED DETECTION FILM

FIELD

The disclosure relates to an infrared detection film, and more particularly to an infrared detection film including a photovoltaic semiconductor layer disposed between source and drain terminals in isolation, an infrared detection sensor and an infrared detection display apparatus including the infrared detection film, and a method of making the infrared detection film.

BACKGROUND

A conventional display apparatus, such as a liquid crystal display (LCD) apparatus or an active matrix organic light emitting display (AMOLED) apparatus, includes a plurality of thin-film transistors (TFTs) and a plurality of pixels that are arranged in an array. Each of the pixels is driven by a respective one of the TFTs for displaying an image. Each of the TFTs is generally a field-effect transistor that includes a semiconductor layer made from a semiconducting material such as amorphous silicon, crystalline silicon, indium gallium zinc oxide (IGZO), a nanocarbon-mixed organic material, and combinations thereof. Since photodiodes may be manufactured using the abovementioned semiconducting material and production equipment of the photodiodes is compatible with production equipment of the TFTs array, a photodetection device, which includes a plurality of the photodiodes and a plurality of the TFTs integrally arranged in an array, is thus produced using the manufacturing procedure of the TFTs array. The photodetection device is utilized in an X-ray flat panel detector disclosed in the Chinese Invention Patent Publication No. CN 103829959 B, and in an X-ray image sensing element and sensing module disclosed in the Chinese Invention Patent Publication No. CN 102903721 B.

The photodiode with the TFT structure may be applicable to the infrared detection field to have infrared detection properties as follows. When a gate electrode of the TFT structure is turned off without a light illuminating the TFT structure, electric current will not be generated between a source terminal and a drain terminal of the TFT structure by means of an electric potential difference between the source terminal and the drain terminal. However, when the gate electrode of the TFT structure is turned off and the TFT structure is illuminated by the light, which has a photon energy higher than that of a band gap of a semiconductor layer disposed between the gate insulating layer and the drain terminal (or the source terminal), electrons of the semiconductor layer will be excited by the light to generate electron-hole pairs. Separation of the electrons and holes will be driven by the electric potential difference between the source terminal and the drain terminal of the TFT so as to generate a current between the source terminal and the drain terminal. The photodiode with the TFT structure that generates the current can be used as an infrared detection sensor to be applicable in infrared detection field, such as those disclosed in Chinese Invention Patent Publication No. CN 100568072 C and Chinese Invention Patent Publication No. CN 105044952 A.

However, photosensitivity and a signal-to-noise ratio of the conventional photodiode with the TFT structure is relatively low, and is not well adapted for detecting an environmental light that has a luminance varying in a range of not less than three orders of magnitude (60 dB), from the darkest region to the brightest region. Hence, improvement in both the photosensitivity of the conventional TFT structure and the signal-to-noise ratio of the conventional photodiode with the TFT structure is required.

In addition, due to limitations of a thickness of the display apparatus and a pixel aperture ratio of the conventional photodetection display apparatus that includes the conventional infrared detection display apparatus, an image generated from the light detected by the photodiodes is distorted because of optical diffraction. Besides, an incident light has to pass through multiple layers of the conventional photodetection display apparatus before being detected by the photodiodes. Thus, it is difficult to abstract useful optical signals from the environment inside the conventional photodetection display apparatus, where the signal-to-noise ratio is relatively low and electrical signals generated by the photodiodes that is received from the optical signals coexist with sensing signals generated by a touch panel that is received from touching signals. The difficulty in abstracting the useful optical signals is approximately equal to that of single-photon imaging. An original image generated by the electrical signals has to be resolved by reconstruction using an algorithm on the basis of an optical theory. In order to deal with the difficulty of abstracting the optical signal, it is proposed that an optical reinforcing member is disposed in the conventional photodetection display apparatus, or the photodiodes are disposed on a side of a display unit, which is shown by a display module disclosed in Chinese Invention Patent Publication No. 101359369 B, so as to reconstruct the image through a light that is not vertically incident on the side of the display unit. However, inclusion of the optical reinforcing member disadvantageously increases the thickness of the photodetection display apparatus and arranging the photodiodes on the side of the display unit tends to impede full-screen viewing.

Besides, a p/i/n structure, which has a boron-doped semiconductor layer, may be applied to the TFT structure of the photodiode that serves as the infrared detection sensor. Boron gas used in the boron-doped semiconductor layer is not environment-friendly and boron-doping of the p/i/n structure is a relatively complicated manufacturing process. Hence, it may be hard to avoid the increase in the production cost and the environmental protection cost for making the photodiode having the p/i/n structure.

SUMMARY

Therefore, an object of the disclosure is to provide an infrared detection film that can alleviate at least one of the drawbacks of the prior art.

According to one aspect of the disclosure, an infrared detection film includes an infrared detection transistor that includes a gate electrode, a gate insulating layer, a majority-carrier channel layer, at least one drain terminal, at least one source terminal, and a photovoltaic semiconductor layer.

The gate insulating layer is surroundingly formed on the gate electrode.

The majority-carrier channel layer is formed on the gate insulating layer.

The at least one drain terminal is disposed on the majority-carrier channel layer and is spaced apart from the gate electrode.

The at least one source terminal is disposed on the majority-carrier channel layer and is spaced apart from the gate electrode and the at least one drain terminal.

The photovoltaic semiconductor layer is disposed on an exposed portion of the majority-carrier channel layer exposed between the at least one drain terminal and the at least one source terminal and is isolated from the at least one drain terminal and the at least one source terminal.

According to another aspect of the disclosure, an infrared detection sensor includes at least one pixel sensing portion including a thin-film transistor for transmitting an electrical signal, and the abovementioned infrared detection film electrically connected to the thin film transistor.

According to another aspect of the disclosure, an infrared detection apparatus includes a display unit defining an infrared detection region, and at least one of the abovementioned infrared detection sensor disposed below the infrared detection region.

According to still another aspect of the disclosure, a method of making the abovementioned infrared detection film adapted to be formed on a substrate provided with a thin-film transistor includes:

forming a gate electrode on the substrate using magnetron sputtering techniques;

surroundingly forming a gate insulating layer on the gate electrode using chemical vapor deposition (CVD) technique or the magnetron sputtering technique;

forming a majority-carrier channel layer on the gate insulating layer;

forming an n-type semiconductor film on the majority-carrier channel layer using the CVD technique;

forming a metal film on the n-type semiconductor film using the magnetron sputtering technique;

patterning the n-type semiconductor film and the metal film to form at least one drain terminal and at least one source terminal using photolithography technique and etching technique, the at least one drain terminal and the at least one source terminal being spaced apart from each other; and forming a photovoltaic semiconductor layer on an exposed portion of the majority-carrier channel layer exposed between the at least one drain terminal and the at least one source terminal in a manner of isolating the photovoltaic semiconductor layer from the at least one drain terminal and the at least one source terminal.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1:
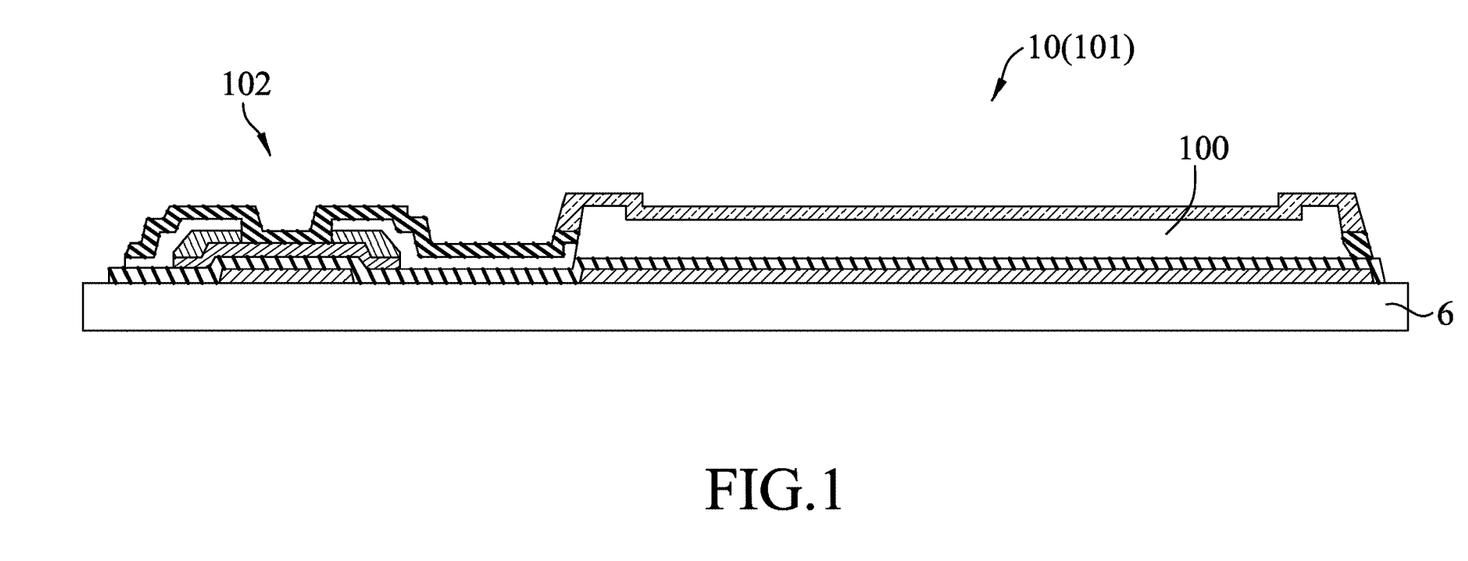
FIG. 1 is schematic view illustrating an embodiment of an infrared detection sensor according to the disclosure.

Referring to FIG. 1, an embodiment of an infrared detection sensor 10 according to the disclosure is illustrated. The embodiment of the infrared-detection sensor 10 is formed on a substrate 6 and includes at least one pixel sensing portion 101. The at least one pixel sensing portion 101 includes a thin-film transistor 102 for transmitting an electrical signal, and a infrared detection film 100 that is electrically connected to the thin film transistor 102.

Figure 2:
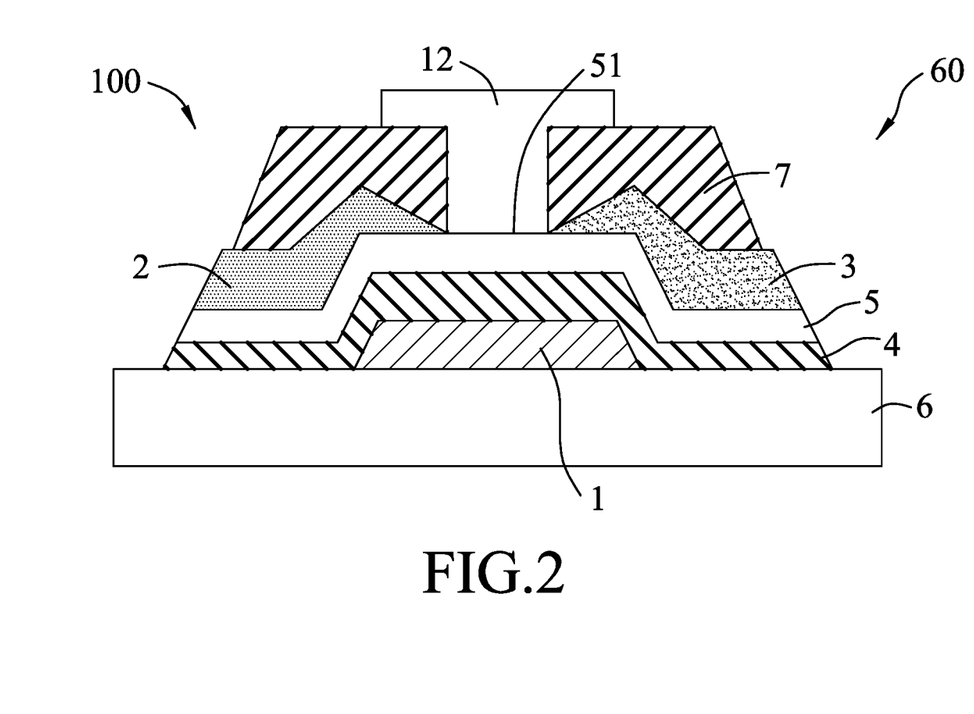
FIG. 2 is a schematic view illustrating a first embodiment of an infrared detection film according to the disclosure.
Figure 6:
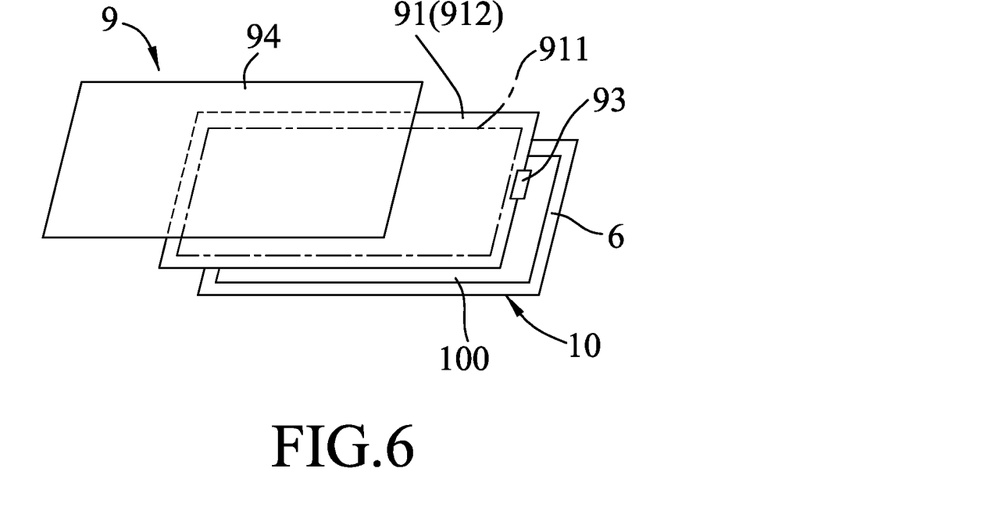
FIG. 6 is a schematic view illustrating an embodiment of the infrared detection display apparatus according to the disclosure.

Referring to FIG. 2, a first embodiment of the infrared detection film 100 includes an infrared detection transistor 60. The disclosure is directed toward improving photosensitivity of the infrared detection transistor 60 and the signal-to-noise ratio of the infrared detection sensor 10, and the infrared detection sensor 10 including the infrared detection film 100 of the disclosure is suitable for application in high photosensitivity fields. For example, the infrared detection sensor 10 may be disposed under a display member 912 of a display unit 91 of a photodetection display apparatus 9 (as shown in FIG. 6).

The infrared-detection transistor 60 includes a gate electrode 1, a gate insulating layer 4, a majority-carrier channel layer 5, at least one drain terminal 3, at least one source terminal 2, and a photovoltaic semiconductor layer 12. The gate insulating layer 4 is surroundingly formed on the gate electrode 1. The majority-carrier channel layer 5 is formed on the gate insulating layer 4. The at least one drain terminal 3 is disposed on the majority-carrier channel layer 5 and is spaced apart from the gate electrode 1. The at least one source terminal 2 is disposed on the majority-carrier channel layer 5 and is spaced apart from the gate electrode 1 and the at least one drain terminal 3. The photovoltaic semiconductor layer 12 is disposed on an exposed portion 51 of the majority-carrier channel layer 5 that is exposed between the at least one drain terminal 3 and the at least one source terminal 2 and is isolated from the at least one drain terminal 3 and the at least one source terminal 2.

The majority-carrier channel layer 5 serves as a transportation channel of the majority carriers. In a semiconductor material, the more abundant charge carriers, which constitute more than one-half of total charge carriers, are called majority carriers. When the semiconductor material has a concentration of electrons higher than that of holes, the electrons will serve as the majority carriers and the holes will serve as minority carriers. In contrast, when the concentration of the holes in the semiconductor material is higher than that of the electrons, the holes will serve as the majority carriers and the electrons will serve as the minority carriers. In the embodiment, the holes (p-type carriers) are the majority carriers in the majority-carrier channel layer 5, and the photovoltaic semiconductor layer 12 is made from n-type semiconductor material.

More specifically, the infrared detection film 100 further includes a source-drain insulating layer 7 that covers the at least one drain terminal 3 and the at least one source terminal 2 and that is interposed between the at least one drain terminal 3 and the photovoltaic semiconductor layer 12, and between the at least one source terminal 2 and the photovoltaic semiconductor layer 12.

When the gate electrode 1 of the infrared detection transistor 60 is turned off and the light having a photon energy higher than a band gap of the photovoltaic semiconductor layer 12 illuminates the infrared detection transistor 60 in a direction extending from the photovoltaic semiconductor layer 12 toward the gate electrode 1, electron-hole pairs are generated in the photovoltaic semiconductor layer 12 to induce a built-in potential difference across a junction between the photovoltaic semiconductor layer 12 and the majority-carrier channel layer 5. The built-in potential difference increases according to the increase in photon energy. When the built-in potential difference is greater than a threshold voltage of the majority-carrier channel layer 5, an electric current will pass through the exposed portion 51 of the majority-carrier channel layer 5 from the at least one drain terminal 3 to at least one source terminal 2 by means of the electric potential difference between the at least one drain terminal 3 and the at least one source terminal 2. Hence, the photovoltaic semiconductor layer 12 may serve as a photovoltaic gate terminal. Since the photovoltaic semiconductor layer 12 is adapted to be disposed as a topmost and farthest layer of the infrared detection transistor 60 relative to the substrate 6 and the gate electrode 1 is adapted to be disposed as a bottommost layer of the infrared detection transistor 60 relative to the substrate 6, excitation of electrons of the photovoltaic semiconductor layer 12 can be enhanced, and photovoltaic conversion efficiency of the infrared detection transistor 60 can be improved.

For a conventional thin-film transistor used for driving and transmitting an electrical signal, a structure for collecting the photoelectric current in the semiconductor layer is not required and thus is not considered. In contrast, for the infrared detection transistor 60 of the infrared detection film 100 of the disclosure, a structure for collecting the photoelectric current, i.e., the light-induced current, is required. In order to improve the current output and to increase a light-absorption area of the photovoltaic semiconductor layer 12, a second embodiment of the infrared detection film 100 according to the disclosure is proposed in addition to the abovementioned structure of the first embodiment of the infrared detection film 100.

Figure 3:
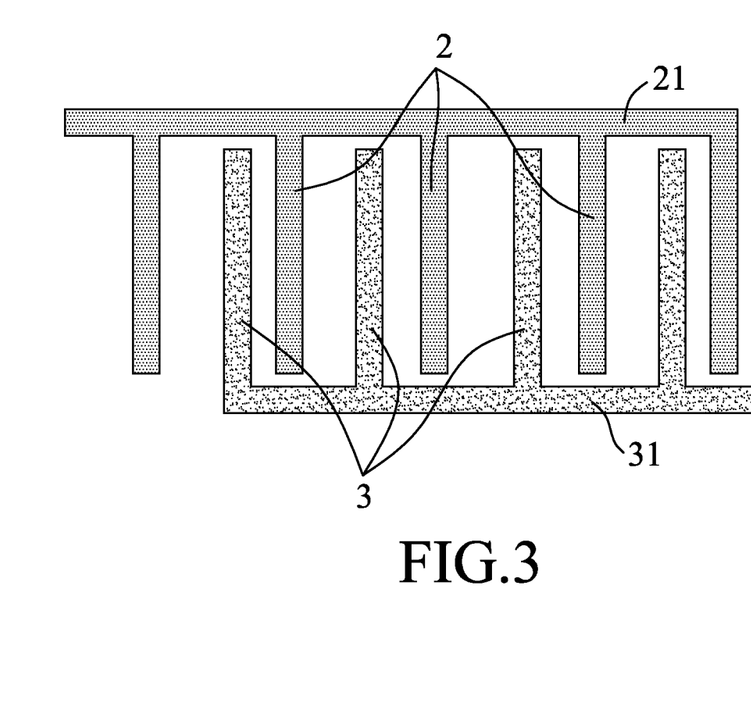
FIG. 3 is a fragmentary, schematic top view illustrating a second embodiment of the infrared detection film according to the disclosure.
Figure 4:
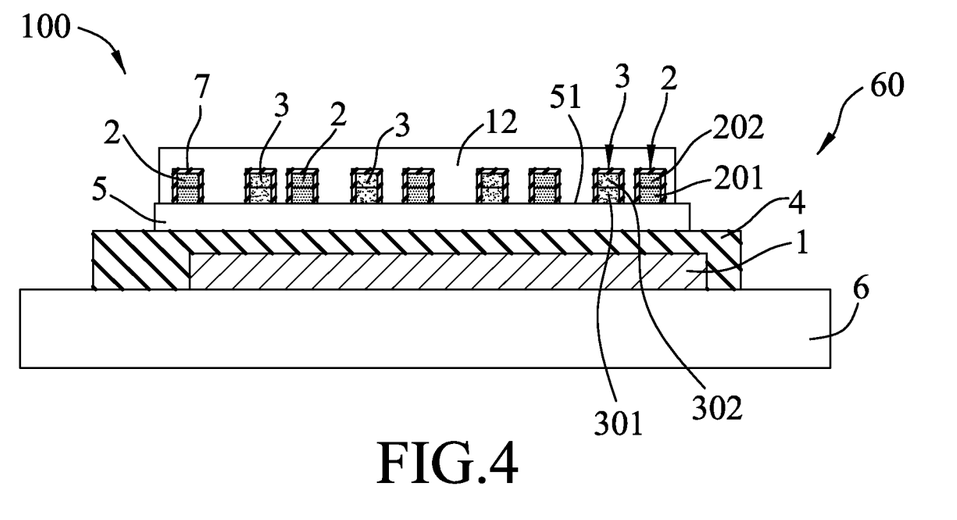
FIG. 4 a schematic view illustrating the second embodiment of the infrared detection film according to the disclosure.

Referring to FIGS. 3 and 4, the infrared detection transistor 60 of the infrared detection film 100 according to the disclosure includes a plurality of the drain terminals 3 that are spaced apart from each other and that are electrically connected in parallel, and a plurality of the source terminals 2 that are spaced apart from each other and that are electrically connected in parallel. The drain terminals 3 and the source terminals 2 are separately and alternately arranged on the majority-carrier channel layer 5. The photovoltaic semiconductor layer 12 is disposed on the exposed portion 51 of the majority-carrier channel layer 5 that is exposed and extends among the drain terminals 3 and the source terminals 2. More specifically, the infrared detection transistor 60 may further include a drain connecting portion 31 and a source connecting portion 21. Each of the drain terminals 3 is connected to the drain connecting portion 31 so that the drain terminals 3 are electrically connected in parallel. Each of the source terminals 2 is connected to the source connecting portion 21 so that the source terminals 2 are electrically connected in parallel. A distance between one of the source terminals 2 and an adjacent one of the drain terminals 3 is smaller than the drift path of the photoelectrons, which is an average moving distance of the photoelectrons, before the photoelectrons recombine with the holes in the majority-carrier channel layer 5. Therefore, the light-absorption area of the photovoltaic semiconductor layer 12 can be increased, so that the photosensitivity of the infrared detection film 100 can be enhanced.

In the embodiment, the source-drain insulating layer 7 and the exposed portion 51 of the majority-carrier channel layer 5 cooperatively define a gap. The photovoltaic semiconductor layer 12 fills the gap.

In one form, the majority-carrier channel layer 5 of the infrared detection transistor 60 has an amorphous silicon structure with a crystallinity of less than 40% and a band gap ranging from 1.7 eV to 1.8 eV. The amorphous silicon structure is formed by mixing a silane and hydrogen gas, in the absence of other dopants, using chemical vapor deposition (CVD) technique. The band gap in electronic volts (eV) is also known as a bandwidth, and refers to an energy difference between a valence band and a conduction band in a band structure. When electrons within a semiconductor material have energy greater than the band gap, the electrons will bound from the valence band to the conduction band gap so as to become free electrons, and thus the semiconductor material will be electrically conductive. The band gap is an important property of the semiconductor material and is determined by a crystal structure and binding properties of atoms, etc.

In one form, the majority-carrier channel layer 5 of the infrared detection transistor 60 has a microcrystalline silicon structure with a crystallinity of more than 40% and a band gap that is less than 1.7 eV.

In the embodiment, in order to expand the light wavelength so that the infrared detection transistor 60 can detect a range of light wavelength from the visible light to the infrared light, the photovoltaic semiconductor layer 12 of the infrared detection transistor 60 is made from a semiconductor material which has an infrared-induced photovoltaic property and a band gap of less than 0.95 eV. Hence, the infrared detection transistor 60 can absorb light having an expanded wavelength ranging from 1200 nm to 2000 nm, and thus expanding the application range of the infrared detection film 100 of the disclosure. In actual practice, the infrared detection sensor 10 is capable of detecting a fingerprint, a face, an eyeball or a posture of a user, etc., when disposed below the display member 912 as mentioned above.

Figure 5:
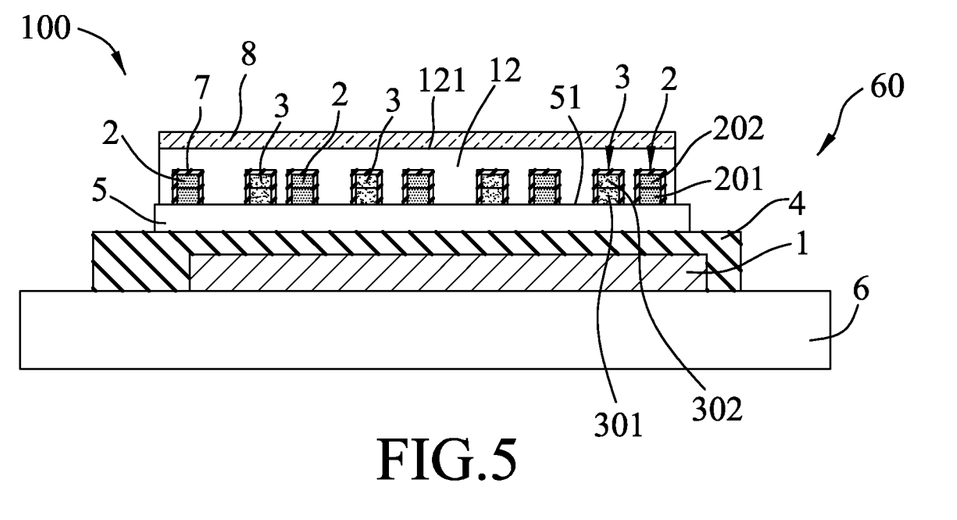
FIG. 5 is a schematic view illustrating another form of the second embodiment of the infrared detection film according to the disclosure.

In one form, referring to FIGS. 5 and 6, each of the drain terminals 3 includes a drain n-type semiconductor layer 301 disposed on the majority-carrier channel layer 5 and a drain electrode 302 disposed on the drain n-type semiconductor layer 301. Each of the source terminals 2 includes a source n-type semiconductor layer 201 disposed on the majority-carrier channel layer 5 and a source electrode 202 disposed on the source n-type semiconductor layer 201. Each of the drain and source n-type semiconductor layers 301, 201 may be formed by mixing a silane, hydrogen gas and an n-type dopant during the CVD. More specifically, the n-type dopant is phosphane and each of the drain and source n-type semiconductor 301, 201 layers may be heavily doped with phosphane to form a heavily phosphorus-doped drain and source semiconductor layers, respectively. The heavily phosphorus-doped drain and source semiconductor layers have a phosphorus doping concentration that is more than twice of a conventional n-type semiconductor layer.

The gate insulating layer 4 is disposed between the gate electrode 1 and the source terminals 2 and between the gate electrode 1 and the drain terminals 3 so as to isolate the source and drain terminals 2, 3 from the gate electrode 1. The source-drain insulating layer 7 covers each of the drain terminals 3 and the source terminals 2. Thus, an undesired electrical short circuit between the conductive components (i.e., the gate electrode 1 and the drain terminals 3, the drain terminals 3 and the source terminals 2, the gate electrode 1 and the source terminals 2) of the infrared detection transistor 60 of the disclosure can be avoided. The gate insulating layer 4 and the source-drain insulating layer 7 are made from an electrically insulating material. According to the Chinese national standards GB2900.5, an electrically insulating material is defined as a material used for making a device to be electrically insulating. The electrically insulating material is able to prevent the current from passing therethrough. In actual practice, the source-drain insulating layer 7 and the gate insulating layer 4 may be made from the identical electrically insulating material or different electrically insulating materials.

In one form, as shown in FIG. 5, the infrared detection film 100 may further include an optical film 8 that is immediately disposed on the source-drain insulating layer 7 for reducing a reflection rate of light from a top surface 121 of the photovoltaic semiconductor layer 12 or reducing a refraction angle of light in the photovoltaic semiconductor layer 12. By reducing the refraction angle of light in the photovoltaic semiconductor layer 12, the light incident upon the photovoltaic semiconductor layer 12 can be as close as possible to a normal line of the photovoltaic semiconductor layer 12 that is perpendicular to the top surface 121. Hence, the light that is absorbed by the photovoltaic semiconductor layer 12 is increased, and thus the photoelectric conversion efficiency of the infrared detection transistor 60 is improved.

More specifically, the optical film 8 has a structure that is selected from a photonic crystal structure with a refractive index varied periodically, a microlens array structure with a refractive index varied periodically, an incident light-scattered crystal structure with a refractive index varied non-periodically, and an incident light-diffused crystal structure with a refractive index varied non-periodically. The optical film 8 has a refractive index smaller than that of the photovoltaic semiconductor layer 12, and thus the light incident upon the photovoltaic semiconductor layer 12 can be as close as possible to the normal line of the photovoltaic semiconductor layer 12 that is perpendicular to the top surface 121. Alternatively, since the majority-carrier channel layer 5 having the amorphous silicon structure or the microcrystalline silicon structure has a relatively high refractive index, the refractive index of the optical film 8 may be designed to be smaller than that of the majority-carrier channel layer 5.

The optical film 8 is made from an oxygen-containing compound or a nitrogen-containing compound and is formed using the CVD technique or the sputtering technique. The oxygen-containing compound may be selected from a group consisting of silicon oxide having a formula of $SiO_x$ with x being not less than 1, niobium pentaoxide ($Nb_5O_5$), zinc oxide (ZnO), indium tin oxide (ITO), and titanium dioxide ($TiO_2$). The nitrogen-containing compound may have a formula of $SiN_y$ with y being not less than 1.

In one form, the semiconductor material of the photovoltaic semiconductor layer 12 may be selected from a quantum dot-containing semiconductor material and an organic nanocarbon semiconductor material. More specifically, the quantum dot-containing semiconductor material may include, but is not limited to lead (II) sulfide-based quantum dots which are synthesized from bis(trimethylsilyl) sulfate ($C_6H_{18}O_4SSi_2$), 1-octadecene ($H_{18}O_{36}$) and lead (II) oxide. The organic nanocarbon semiconductor material may be prepared by forming a heterojunction layer between nanocarbon tubes and nanocarbon balls using toluene as a solvent.

In one form, the infrared detection sensor 10 may include a plurality of the pixel sensing portions 101. Each of the pixel sensing portions 101 is used for sensing a pixel area. The pixel sensing portions 101 may be arranged in an array. As mentioned above, in actual practice, the infrared detection sensor 10 may be disposed under the display member 912 (as shown in FIG. 6) so as to perform an image sensing function. For instance, when the display member 912 has a resolution of 1920×1080, the infrared detection sensor 10 may have the pixel sensing portions 101 in an amount of 1920×1080.

Referring to FIG. 6, an embodiment of the infrared detection display apparatus 9 according to the disclosure includes the display unit 91 defining a infrared detection region 911, at least one of the infrared detection sensor 10 disposed under the infrared detection region 911, a glass covering plate 94 disposed on the display unit 91 for protecting the display unit 91, and a drive and control circuit unit 93 electrically connected to the display unit 91. The infrared detection display apparatus 9 may be an electronic apparatus including a touchable display screen, such as a portable apparatus (e.g. a cell phone, a tablet computer, a personal digital assistant (PDA), etc.), a personal computer, or an industrial computer. The display unit 91 may include a thin-film transistor for driving the display member 912 and transmitting electrical signals. The display member 912 may be selected from an active matrix organic light emitting diode (AMOLED) display device, a liquid crystal display (LCD) device, a micro light emitting diode (LED), a quantum dot display device, and an electronic ink (E-ink) display device.

Figure 7:
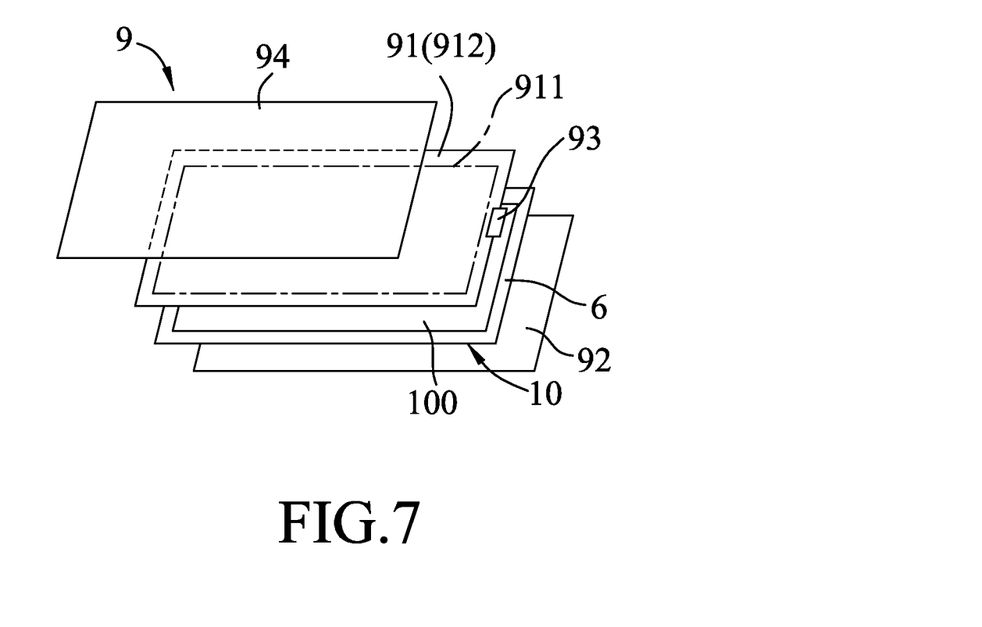
FIG. 7 is a schematic view illustrating another form of the embodiment of the infrared detection display apparatus according to the disclosure.

Referring to FIG. 7, in one form, the display member 912 of the display unit 91 is the LCD device or the E-ink display device, and the infrared detection display apparatus 9 may further include a backlight unit 92 that is disposed below the at least one of the infrared detection sensor 10 such that the at least one of the infrared detection sensor 10 is disposed between the display unit 91 and the backlight unit 92. Since the LCD device or the E-ink display device is not self-luminous, the backlight unit 92 is required to be disposed below the LCD device or the E-ink display device. The backlight unit 92 may be in the form of a LCD backlight module, or other self-luminous electronic devices. Alternatively, when the display member 912 is a self-luminous OLED device (e.g., the AMOLED device), the infrared detection display apparatus 9 may be free of the backlight unit 92. By way of the abovementioned alternative forms of the display member 912, the application range of the infrared detection display apparatus 9 of the disclosure can be expanded. The drive and control circuit 93 of the infrared detection display apparatus 9 is configured to turn on and turn off the at least one infrared detection sensor 10 upon receiving turn-on and turn-off signals inputted by a user, respectively.

In one form, the display unit 91 defines a plurality of the infrared detection regions 911. The infrared detection display apparatus 9 includes a plurality of the infrared detection sensors 10, each of which corresponds in position to a respective one of the infrared detection regions 911.

When the number of the infrared detection regions 911 of the display unit 91 and the number of the infrared detection sensors 10 are respectively exemplified to be two, the infrared detection regions 911 may be respectively located on top and bottom of the display unit 91, or may be respectively located at left and right sides of the display unit 91. More specifically, each of the infrared detection sensors 10 is disposed beneath a respective one of the infrared detection regions 911. The infrared detection sensors 10 are turned on and turned off by the turn-on and turn-off signals inputted by the user. In one form, the infrared detection regions 911 cooperatively cover the entire area of the display member 912, so that all of the light passing through the infrared detection regions 911 of the display unit 91 can be absorbed by the infrared detection sensors 10. In another form, the infrared detection sensors 10 may cover two-thirds or three-fourths of the area of the display member 912. The infrared detection sensors 10 may be controlled in such a manner that one of the infrared detection sensors 10 is turned on, and the other one of the infrared detection sensors 10 is turned off.

In one form, the number of the infrared detection regions 911 may be more than two and may be varied based on actual use, and the turn-on or turn-off states of the infrared detection sensors 10 may be separately controlled by the user.

Figure 8:
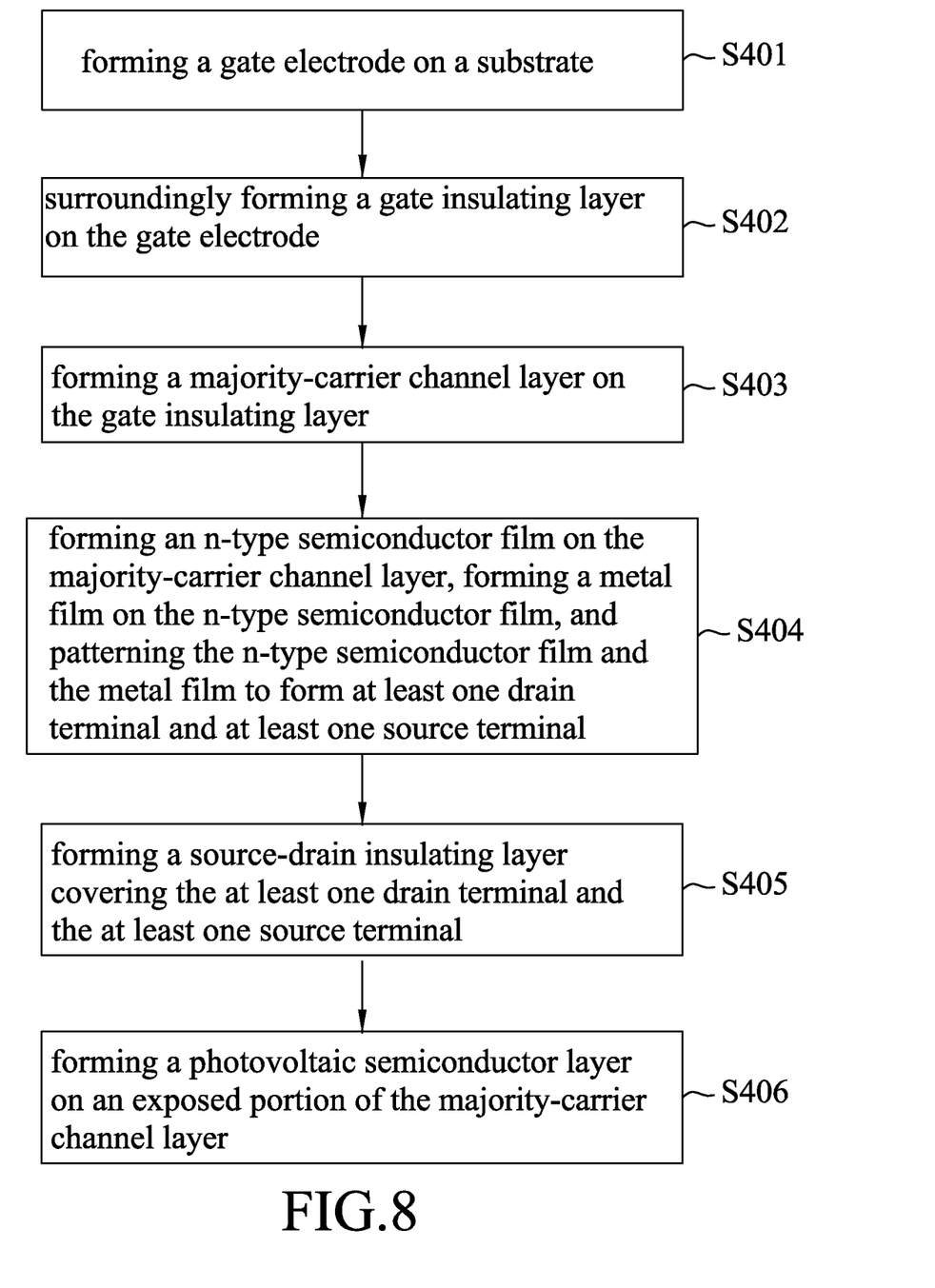
FIG. 8 is a flow chart of a first embodiment of a method of making an infrared detection film according to the disclosure.
Figure 9:
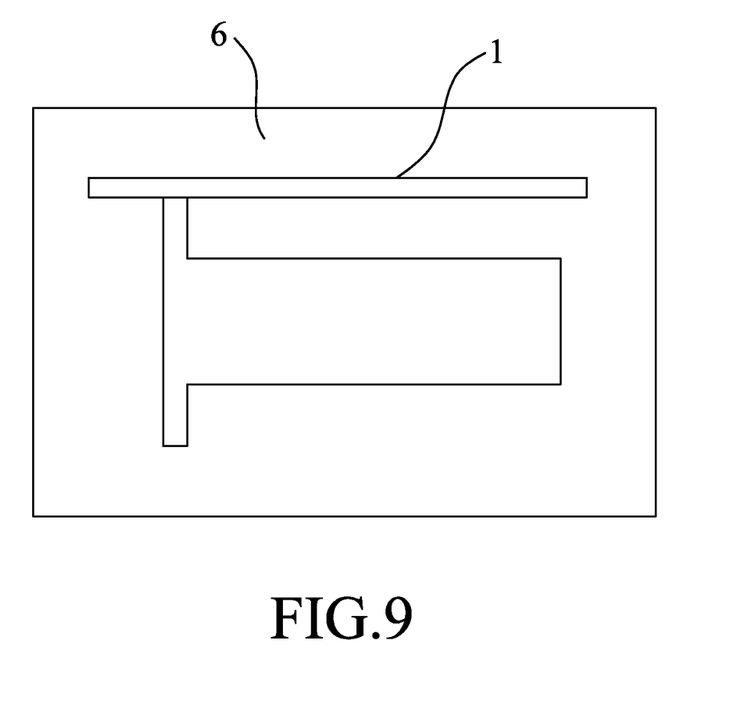
FIGS. 9 to 18 are schematic views illustrating consecutive steps of a second embodiment of a method of making an infrared detection film according to the disclosure.
Figure 10:
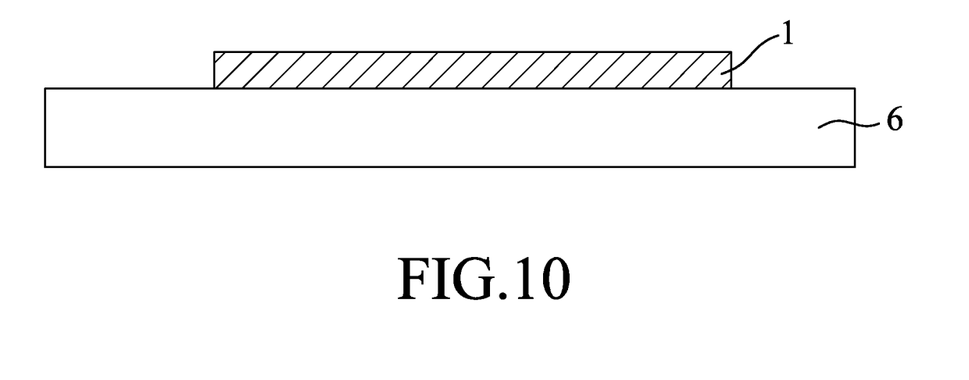
Figure 11:
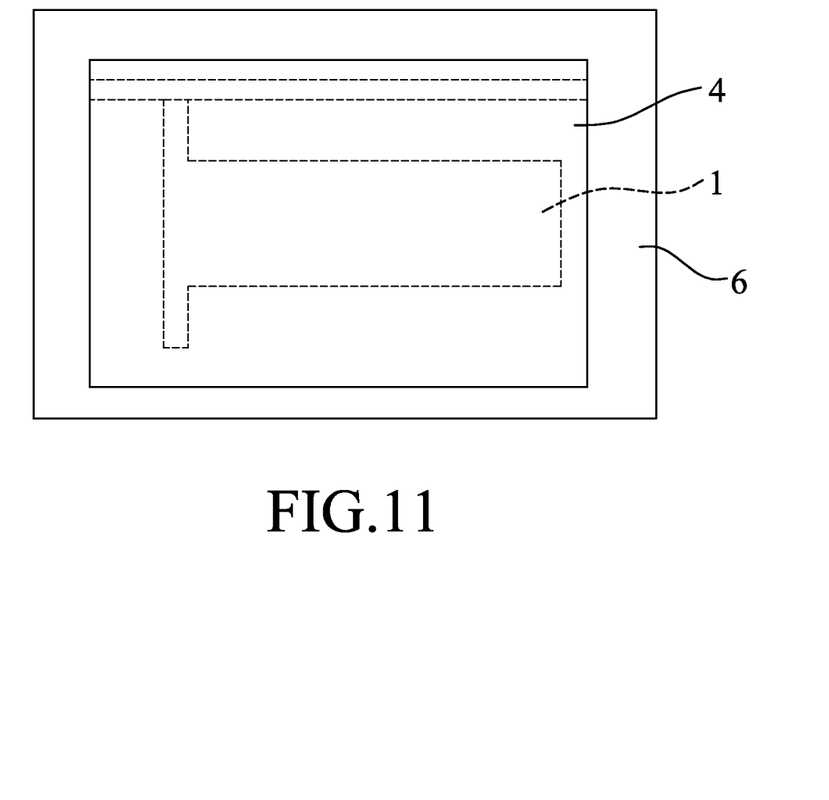
Figure 12:
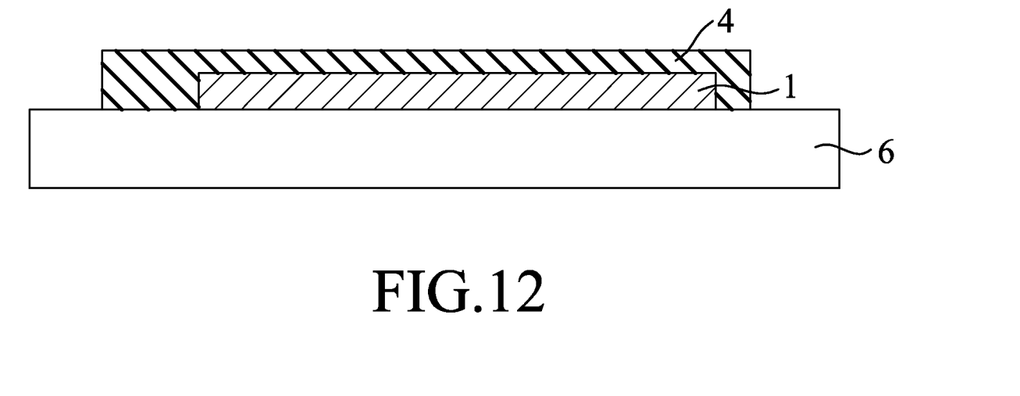
Figure 13:
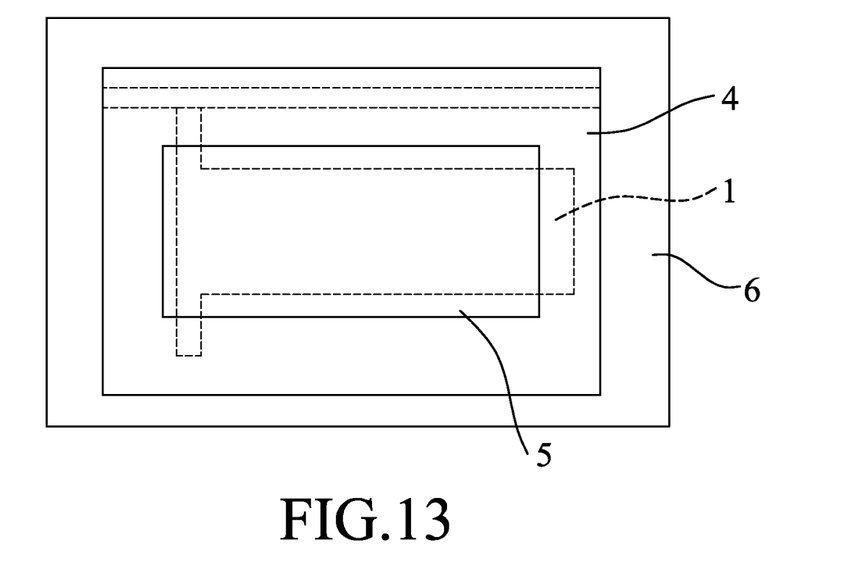
Figure 14:
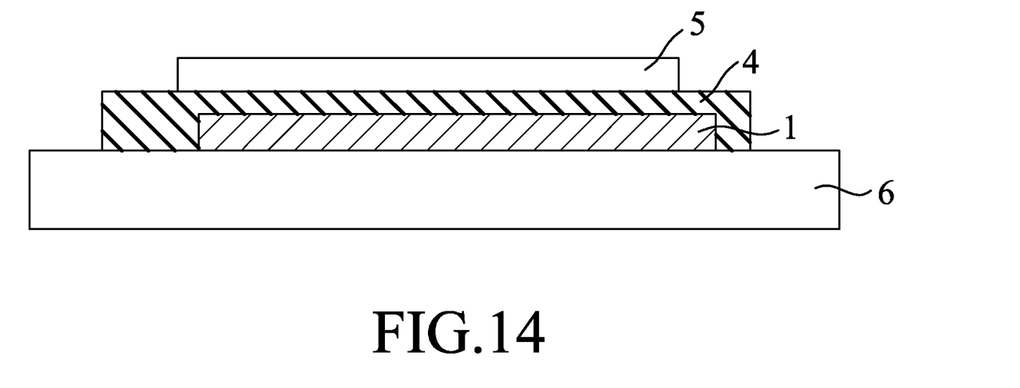
Figure 15:
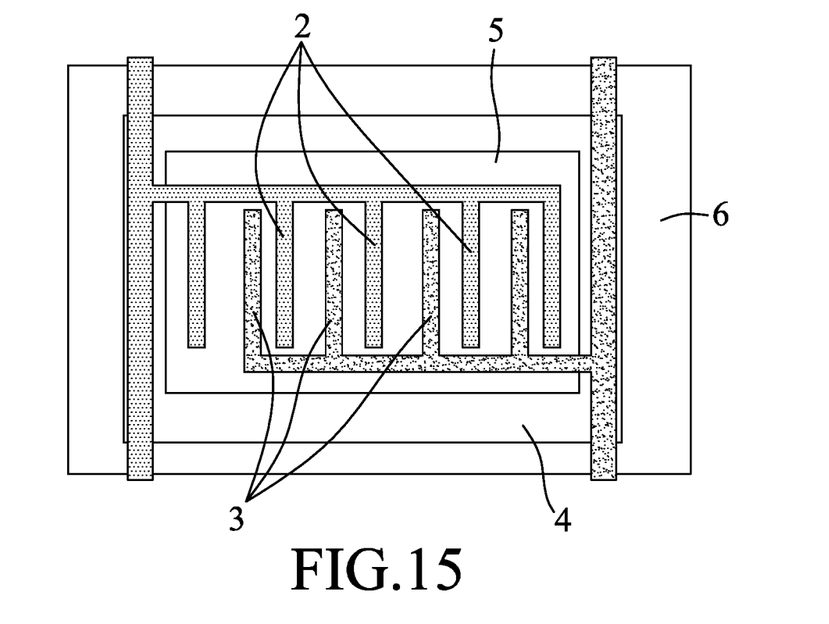
Figure 16:
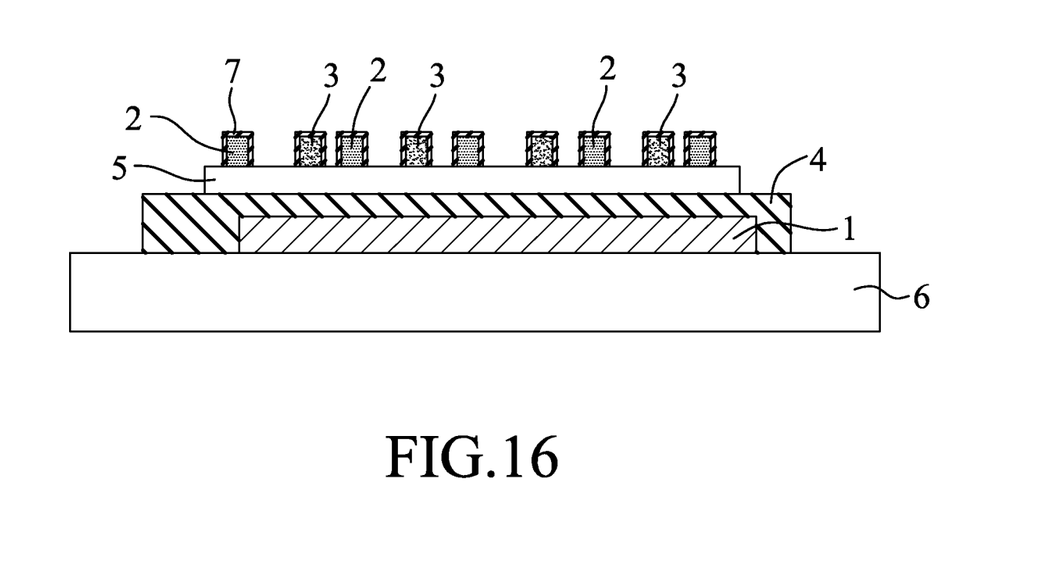
Figure 17:
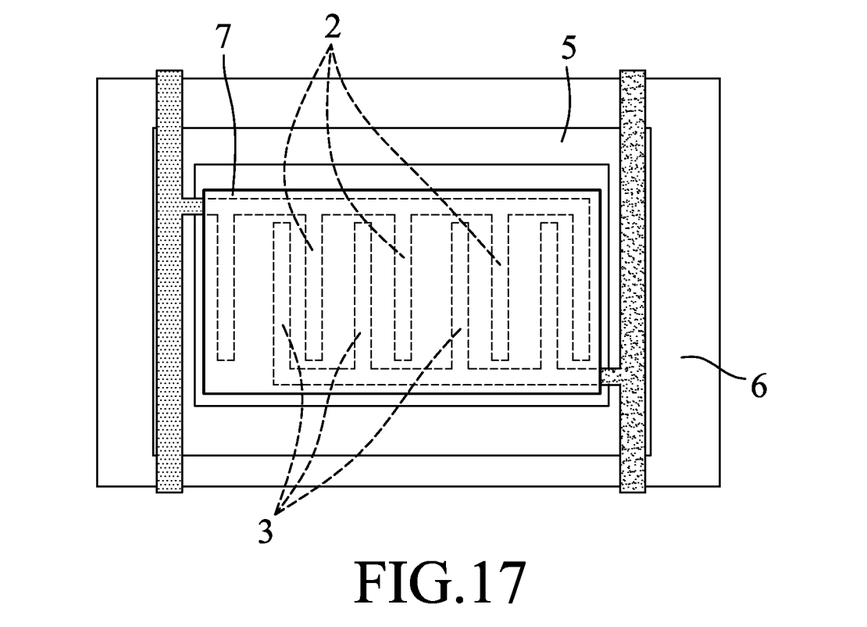
Figure 18:
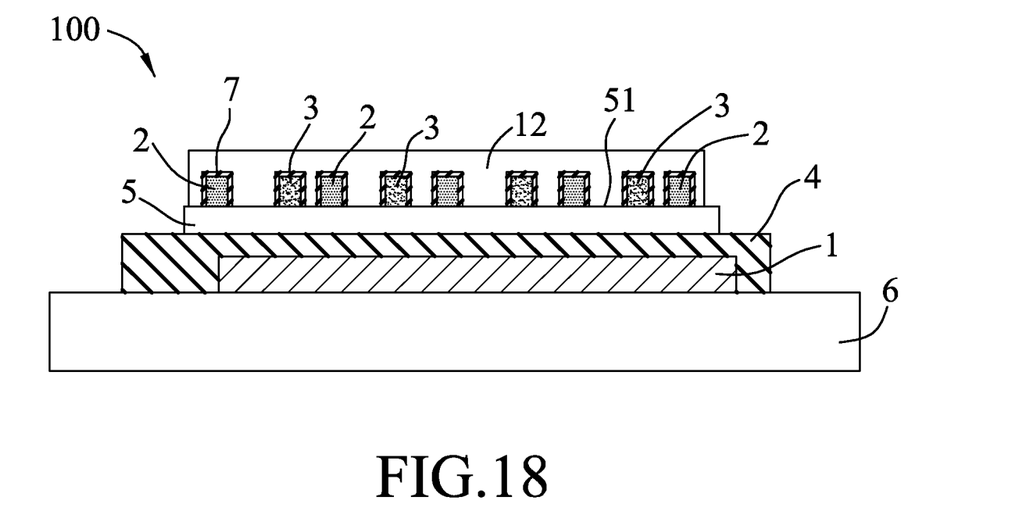

Referring to FIG. 8, a first embodiment of a method of making an infrared detection film 100 that is adapted to be formed on the substrate 6 provided with the thin-film transistor 102 is illustrated. In this embodiment, the infrared detection film 100 to be made is the infrared detection film 100 as shown in FIG. 2. The embodiment of the method includes Steps S401 to S406.

In Step S401, the gate electrode 1 is formed on the substrate 6 using magnetron sputtering technique. The substrate 6 may be made of an inflexible material or a flexible material, such as polyimide.

In Step S402, a gate insulating layer 4 is surroundingly formed on the gate electrode 1 using the CVD technique or the magnetron sputtering technique.

In Step S403, the majority-carrier channel layer 5 is formed on the gate insulating layer 4.

In Step S404, an n-type semiconductor film is formed on the majority-carrier channel layer 5 using the CVD technique, a metal film is formed on the n-type semiconductor film, and the n-type semiconductor film and the metal film is patterned to form the at least one drain terminal 3 and the at least one source terminal using photolithography technique and etching technique. The at least one drain terminal 3 and the at least one source terminal 2 are spaced apart from each other.

In Step S405, a source-drain insulating layer 7 is formed. The source-drain insulating layer 7 covers the at least one drain terminal 3 and the at least one source terminal 2 so as to isolate each of the at least one drain terminal 3 and the at least one source terminal 2.

In Step S406, the photovoltaic semiconductor layer is formed on the exposed portion 51 of the majority-carrier channel layer 5 that is exposed between the at least one drain terminal 3 and the at least one source terminal 2 so as to isolate the photovoltaic semiconductor layer 12 from the at least one drain terminal 3 and the at least one source terminal 2. The photovoltaic semiconductor layer 12 may be formed using a process selected from the group consisting of an evaporation technique, a coating technique, a spraying technique, a screen printing technique, and combinations thereof.

Referring to FIGS. 9 to 18, a second embodiment of a method of making an infrared detection film 100 of the disclosure is illustrated. In this embodiment, the infrared detection film 100 to be formed is the infrared detection film 100 as shown in FIGS. 3 and 4. In Step S404, the patterning of the n-type semiconductor film (not shown) and the metal film (not shown) includes forming the drain terminals 3 that are spaced apart from each other and that are electrically connected in parallel, and the source terminals 2 that are spaced apart from each other and that are electrically connected in parallel, such that the drain terminals 3 and the source terminals 2 are spaced apart from one another and alternately arranged on the gate insulating layer 4. More specifically, the photovoltaic semiconductor layer 12 fills the gap that is defined by the source-drain insulating layer 7 in cooperation with the exposed portion 51 of the majority-carrier channel layer 5.

In one form, the majority-carrier channel layer 5 has amorphous silicon structure that is formed by mixing a silane and hydrogen gas during the CVD, such that the amorphous silicon structure has a crystallinity of less than 40% and a band gap ranging from 1.7 eV to 1.8 eV.

In one form, the majority-carrier channel layer 5 has microcrystalline silicon structure that is formed by mixing a silane and hydrogen gas during the CVD, such that the microcrystalline silicon structure has a crystallinity of more than 40% and a band gap of less than 1.7 eV.

In the embodiment, forming of the n-type semiconductor film includes mixing a silane, phosphine and hydrogen gas during the CVD. In one form, the method of making the infrared detection film of the disclosure may further include forming the optical film 8 (as shown in FIG. 5) on the photovoltaic semiconductor layer 12 for reducing a reflection rate of light from the top surface 51 of the light-absorbing majority-carrier channel layer 5 or reducing a refraction angle of light in the photovoltaic semiconductor layer 12.

The optical film 8 is made from an oxygen-containing compound or a nitrogen-containing compound and is formed using the CVD technique or the magnetron sputtering technique. The oxygen-containing compound may be selected from a group consisting of silicon oxide having a formula of $SiO_x$ with x being not less than 1, niobium pentaoxide ($Nb_5O_5$), zinc oxide (ZnO), indium tin oxide (ITO), and titanium dioxide ($TiO_2$). The nitrogen-containing compound may have a formula of $SiN_y$ with y being not less than 1.

By virtue of the arrangement of the infrared detection sensor 10 including the infrared detection film 100, the infrared detection transistor 60 is a bottom-gate structure relative to the substrate 6 with the gate electrode 1 being proximal to the substrate 6. In addition, by the inclusion of the source-drain insulating layer 7 covering the drain terminals 3 and the source terminals 2, the source terminals 3 and the drain terminals 2, which are spaced apart from each other, are respectively spaced apart from the photovoltaic semiconductor layer 12.

Furthermore, by virtue of the arrangement of the infrared detection film 100, since the photovoltaic semiconductor layer 12 fills the gap defined by the source-drain insulating layer 7 and the exposed portion 51 of the majority-carrier channel layer 5, the photoelectrons generated in the photovoltaic semiconductor layer 12, which are excited from the ground state to the excited state, are increased. Furthermore, in the pixel sensing portion 101 of the infrared detection sensor 10, the drain terminals 3 are electrically connected in parallel and the source terminals 2 are electrically connected in parallel. Therefore, when a predetermined electrical potential difference is applied between the drain terminals 3 and the source terminals 2, the photoelectrons collected by the drain terminals 3 (or the source terminals 2) are increased and the recombination of the excited electrons and the holes is reduced, and thus improvements in the photosensitivity of the infrared detection film 100 can be achieved. Moreover, since the infrared detection film 100 of the disclosure is not doped with a boron gas, boron pollution can be avoided during the manufacturing of the infrared detection film 100.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An infrared detection film, comprising:
    an infrared detection transistor including
        a gate electrode;
        a gate insulating layer that is surroundingly formed on said gate electrode;
        a majority-carrier channel layer that is formed on said gate insulating layer;
        at least one drain terminal that is disposed on said majority-carrier channel layer and that is spaced apart from said gate electrode;
        at least one source terminal that is disposed on said majority-carrier channel layer and that is spaced apart from said gate electrode and said at least one drain terminal; and
        a photovoltaic semiconductor layer that is disposed on an exposed portion of said majority-carrier channel layer exposed between said at least one drain terminal and said at least one source terminal and that is isolated from said at least one drain terminal and said at least one source terminal.

2. The infrared detection film of claim 1, further comprising a source-drain insulating layer interposed between said at least one drain terminal and said photovoltaic semiconductor layer and between said at least one source terminal and said photovoltaic semiconductor layer.

3. The infrared detection film of claim 2, wherein said infrared detection transistor includes a plurality of said drain terminals that are spaced apart from each other and that are electrically connected in parallel, and a plurality of said source terminals that are spaced apart from each other and that are electrically connected in parallel, said drain terminals and said source terminals being separately and alternately arranged on said majority-carrier channel layer, said photovoltaic semiconductor layer being disposed on said exposed portion of said majority carrier channel layer exposed among said drain terminals and said source terminals.

4. The infrared detection film of claim 3, wherein said source-drain insulating layer and said exposed portion of said majority-carrier channel layer cooperatively define a gap, said photovoltaic semiconductor layer filling said gap.

5. The infrared detection film of claim 1, wherein said photovoltaic semiconductor layer is made from a semiconductor material having infrared-induced photovoltaic property and a band gap of less than 0.95 eV.

6. The infrared detection film of claim 5, wherein said semiconductor material is selected from a quantum dot-containing semiconductor material and an organic nanocarbon semiconductor material.

7. The infrared detection film of claim 1, wherein said majority-carrier channel layer of said infrared detection transistor has an amorphous silicon structure with a crystallinity of less than 40% and a band gap ranging from 1.7 eV to 1.8 eV.

8. The infrared detection film of claim 1, wherein said majority-carrier channel layer of said infrared detection transistor has a microcrystalline silicon structure with a crystallinity of more than 40% and a band gap of less than 1.7 eV.

9. The infrared detection film of claim 1, wherein said at least one drain terminal includes a drain n-type semiconductor layer disposed on said majority-carrier channel layer and a drain electrode disposed on said drain n-type semiconductor layer, said at leak one source terminal including a source n-type semiconductor layer disposed on said majority-carrier channel layer and a source electrode disposed on said source n-type semiconductor layer.

10. The infrared detection film of claim 1, further comprising an optical film that is immediately disposed on said photovoltaic semiconductor layer for reducing a reflection rate of light from a top surface of said photovoltaic semiconductor layer or reducing a refraction angle of light in said photovoltaic semiconductor layer.

11. The infrared detection film of claim 10, wherein said optical film has a structure selected from a photonic crystal structure with a refractive index varied periodically, a microlens array structure with a refractive index varied periodically, an incident light-scattered crystal structure with a refractive index varied non-periodically, and an incident light-diffused crystal structure with a refractive index varied non-periodically, said optical film having a refractive index smaller than that of said photovoltaic semiconductor layer.

12. The infrared detection film of claim 10, wherein said optical film is made from an oxygen-containing compound or a nitrogen-containing compound.

13. The infrared detection film of claim 12, wherein the oxygen-containing compound is selected from a group consisting of silicon oxide having a formula of $SiO_x$ with x being not less than 1, niobium pentaoxide ($Nb_2O_5$), zinc oxide (ZnO), indium tin oxide (ITO), and titanium dioxide ($TiO_2$); and wherein the nitrogen-containing compound has a formula of $SiN_y$ with y being not less than 1.

14. An infrared detection sensor, comprising:
- at least one pixel sensing portion including a thin-film transistor for transmitting an electrical signal, and
- said infrared detection film as claimed in claim 1 that is electrically connected to said thin-film transistor.

15. An infrared detection display apparatus, comprising: a display unit defining an infrared detection region; and at least one infrared detection sensor as claimed in claim 14 that is disposed below said infrared detection region.

16. The infrared detection display apparatus of claim 15, wherein said display unit includes a display member selected from an active matrix organic light emitting diode (AMOLED) display device, a liquid crystal display (LCD) device, a micro light emitting diode (LED) a quantum dot display device, and an electronic ink (E-ink) display device.

17. The infrared detection display apparatus of claim 16, wherein said display member of said display unit is the LCD device or the E-ink display device, said infrared detection display apparatus further comprising a backlight unit that is disposed below said at least one infrared detection sensor such that said at least one infrared detection sensor is disposed between said display unit and said backlight unit.

18. The infrared detection display apparatus of claim 15, wherein said display unit defines a plurality of said infrared detection regions, said infrared detection display apparatus including a plurality of said infrared detection sensors, each of which corresponds in position to a respective one of said infrared detection regions.

19. The infrared detection display apparatus of claim 15, further comprising a drive and control circuit unit configured to turn on and turn off said at least one infrared detection sensor upon receiving turn-on and turn-off signals inputted by a user, respectively.

20. A method of making an infrared detection film adapted to be formed on a substrate provided with a thin-film transistor, comprising:
- forming a gate electrode on the substrate using magnetron sputtering technique;
- surroundingly forming a gate insulating layer on the gate electrode using chemical vapor deposition (CVD) technique or the magnetron sputtering technique;
- forming a majority-carrier channel layer on the gate insulating layer;
- forming an n-type semiconductor film on the majority-carrier channel layer using the CVD technique;
- forming a metal film on the n-type semiconductor film using the magnetron sputtering technique;
- patterning the n-type semiconductor film and the metal film to form at least one drain terminal and at least one source terminal using photolithography technique and etching technique; the at least one drain terminal and the at least one source terminal being spaced apart from each other; and
- forming a photovoltaic semiconductor layer on an exposed portion of the majority-carrier channel layer exposed between the at least one drain terminal and the at least one source terminal so as to isolate the photovoltaic semiconductor layer from the at least one drain terminal and the at least one source terminal.

21. The method of claim 20, further comprising forming a source-drain insulating layer covering the at least one drain terminal and the at least one source terminal so as to isolate each of the at least one drain terminal and the at least one source terminal from the photovoltaic semiconductor layer.

22. The method of claim 20, wherein the patterning of the n-type semiconductor film and the metal film includes forming a plurality of the drain terminals that are spaced apart from each other and that are electrically connected in parallel, and a plurality of the source terminals that are spaced apart from each other and that are electrically connected in parallel.

23. The method of claim 20, wherein the majority-carrier channel layer has an amorphous silicon structure formed by mixing a silane and hydrogen gas during the CVD, such that the amorphous silicon structure has a crystallinity of less than 40% and a band gap ranging from 1.7 eV to 1.8 eV.

24. The method of claim 20, wherein the majority-carrier channel layer has a microcrystalline silicon structure formed by mixing a silane and hydrogen gas during the CVD, such that the microcrystalline silicon structure has a crystallinity of more than 40% and a band gap of less than 1.7 eV.

25. The method of claim 20, wherein the photovoltaic semiconductor layer is made from a semiconductor material having infrared photovoltaic property and a band gap of less than 0.95 eV.

26. The method of claim 25, wherein the semiconductor material is selected from a quantum dot-containing material and an organic nanocarbon semiconductor material.

27. The method of claim 20, wherein the forming of the n-type semiconductor film includes mixing a silane, phosphine and hydrogen gas during the CVD.

28. The method of claim 20, further comprising forming an optical film on the photovoltaic semiconductor layer for reducing a reflection rate of light from a top surface of the photovoltaic semiconductor layer or reducing a refraction angle of light in the photovoltaic semiconductor layer.

29. The method of claim 28, wherein the optical film is selected from a photonic crystal structure with a refractive index varied periodically, a microlens array structure with a refractive index varied periodically, an incident light-scattered crystal structure with a refractive index varied non-periodically, and an incident light-diffused crystal structure with a refractive index varied non-periodically, the optical film having a refractive index smaller than that of the majority-carrier channel layer.

30. The method of claim 29, wherein the optical film is made from one of an oxygen-containing compound and a nitrogen-containing compound using the CVD technique or the sputtering technique.

31. The method of claim 30, wherein the oxygen-containing compound is selected from a group consisting of silicon oxide having a formula of $SiO_x$, with x being not less than 1, niobium pentaoxide ($Nb_2O_5$), zinc oxide (ZnO), indium tin oxide (ITO), titanium dioxide ($TiO_2$); and wherein the nitrogen-containing compound has a formula of $SiN_y$, with y being not less than 1.

32. The method of claim 20, wherein the photovoltaic semiconductor layer is formed using a process selected from the group consisting of an evaporation technique, a coating technique, a spraying technique, a screen printing technique, and combinations thereof.

* * * * *